United States Patent [19]
Ramesh et al.

[11] Patent Number: 5,168,420
[45] Date of Patent: Dec. 1, 1992

[54] FERROELECTRICS EPITAXIALLY GROWN ON SUPERCONDUCTING SUBSTRATES

[75] Inventors: Ramamoorthy Ramesh, Eatontownship, Monmouth County; Jean-Marie Tarascon, Martinsville, both of N.J.

[73] Assignee: Bell Communications Research, Inc., Livingston, N.J.

[21] Appl. No.: 616,166

[22] Filed: Nov. 20, 1990

[51] Int. Cl.⁵ .......................... H01G 4/10; H01G 7/00
[52] U.S. Cl. ........................................ 505/1; 361/321; 29/25.42
[58] Field of Search .................. 29/25.42; 505/1; 361/321

[56] References Cited

U.S. PATENT DOCUMENTS

| | | | |
|---|---|---|---|
| 3,579,063 | 5/1971 | Wasa et al. | 361/311 |
| 3,728,694 | 4/1973 | Rohrer | 340/173.2 |
| 4,707,897 | 11/1987 | Rohrer et al. | 29/25.42 |
| 4,713,157 | 12/1987 | McMillan et al. | 204/192.11 |
| 4,872,086 | 10/1989 | Huang et al. | 361/321 |
| 5,046,043 | 9/1991 | Miller et al. | 361/321 X |
| 5,070,026 | 12/1991 | Greenwald et al. | 437/3 |

FOREIGN PATENT DOCUMENTS

| | | | |
|---|---|---|---|
| 273244 | 11/1988 | Japan | 505/1 |
| 108121 | 4/1989 | Japan | 505/1 |
| 145397 | 6/1989 | Japan | 505/1 |
| 278080 | 11/1989 | Japan | 505/1 |

OTHER PUBLICATIONS

J. F. Scott et al., "Ferroelectric Memories," *Science*, 1989, vol. 246, pp. 1400-1405.
D. Bondurant et al., "Ferroelectrics for nonvolatile RAMs," *IEEE Spectrum*, Jul. 1989, pp. 30-33.
H. Parker et al., "Ferroelectric Materials for 64 Mb and 256 Mb DRAMs," *IEEE Circuits and Devices Magazine*, Jan. 1990, pp. 17-26.
K. Iijima et al., "Preparation of ferroelectric BaTiO₃ thin films by activated reactive evaporation," *Applied Physics Letters*, 1990, vol. 56, pp. 527-529.
G. M. Davis et al., "Epitaxial growth of thin films of BaTiO₃ using excimer laser ablation," *Applied Physics Letters*, 1989, vol. 55, pp. 112-114.
A. F. Wells, "Structural Inorganic Chemistry," 4th ed. (Clarendon Press, 1975), pp. 149-154.
E. Chase et al., "Multilayer high $T_c$ thin film structures fabricated by pulsed laser deposition," *Journal of Materials Research*, 1989, vol. 4, pp. 1326-1329.
B. S. Kwak et al., "Metalorganic chemical vapor deposition of PbTiO₃ thin films," *Applied Physics Letters*, 1988, vol. 53, pp. 1702-1704.

*Primary Examiner*—Donald A. Griffin
*Attorney, Agent, or Firm*—Leonard Charles Suchyta; Charles S. Guenzer

[57] ABSTRACT

A ferroelectric storage element and its method of growth. A thin ferroelectric film, for example, of bismuth titanate, is epitaxially grown on a perovskite crystalline substrate of thin film that is superconductive at some temperature. For example, the thin film may be $YBa_2Cu_3O_{7-x}$, $Bi_2Sr_2CuO_{6+x}$, or $Bi_2Sr_2CaCu_2O_{8+x}$.

23 Claims, 1 Drawing Sheet

FERROELECTRICS EPITAXIALLY GROWN ON SUPERCONDUCTING SUBSTRATES

FIELD OF THE INVENTION

The invention relates in general to ferroelectric materials; in particular, it relates to ferroelectric materials epitaxially grown on crystalline superconductive cuprate oxides.

BACKGROUND ART

Ferroelectric memories have received much recent interest as dense randomly accessible memories although the concept for such memories originated several decades ago. See for example, the following recent review articles: "Ferroelectric Memories" by Scott et al. in *Science*, volume 246, 1989, pages 1400-1405, "Ferroelectrics for nonvolatile RAMs" by Bondurant et al. in *IEEE Spectrum*, July, 1989, pages 30-33, and "Ferroelectric Materials For 64 Mb and 256 Mb DRAMs," by Parker et al., in *IEEE Circuits and Devices Magazine*, January 1990, pages 17-26. Because of their high charge storage capability, they may be integrated more densely than possible even semiconductor memories. They also offer non-volatile memory, that is, data is retained in a ferroelectric memory even if power is interrupted.

In a ferroelectric material, an electric dipole is created by the relative displacement of positive and negative ions, e.g., $Ti^{4+}$ and $O^{2-}$ in $PbTiO_3$. In ferroelectrics, similarly to dielectrics, an applied electric field E can induce the dipole, which can be expressed in terms of polarization P, as illustrated in FIG. 1, and which in turn is directly related to a surface charge density expressed in units of $\mu C/cm^2$. FIG. 1 does not show the initial priming in which the characteristics start from the origin. A saturation polarization $P_S$ corresponds to maximum displacements of the ions. Unlike dielectrics, in ferroelectric materials, the dipole remains after the electric field is removed (remanent polarization $P_R$). Furthermore, positive and negative electric fields will produce positive and negative remanent polarizations, respectively. A coercive field $E_C$ is required to switch between the two polarizations. A ferroelectric memory array can be fabricated as an array of capacitors having ferroelectric material in the gap of the capacitors. A ferroelectric capacitor, once switched into its up-state or down-state, that is, 0-state or 1-state, stays in that state until switched again. Further, the state of the ferroelectric capacitor can be interrogated by measuring the polarity of the voltage induced on its electrodes by the switched ferroelectric material.

It was early recognized that bulk ferroelectrics were unsatisfactory for memories because the coercivity or switching fields were of the order of thousands of volts per centimeter, causing excessively high switching voltages. However, ferroelectric thin films avoid the problem of large voltages by reducing the thickness of the ferroelectric to obtain the required switching fields $E_C$ with voltages common in semiconductor circuits. As has been disclosed by Rohrer in U.S. Pat. No. 3,728,694, ferroelectric thin film capacitors are made by depositing a metallic lower electrode, depositing the ferroelectric layer on the lower electrode, and then depositing an upper metallic electrode. More advanced techniques for integrating ferroelectric memories with a semiconductor integrated circuit are disclosed by McMillan et al. in U.S. Pat. No. 4,713,157 and by Rohrer et al. in U.S. Pat. No. 4,707,897. For example, in order to integrate semiconductor gates with the ferroelectric capacitor, a lower electrode of aluminum is deposited on a silicon substrate. The aluminum forms as a polycrystalline layer. The then deposited ferroelectric, usually having a perovskite crystal structure in the bulk, grows in polycrystalline form as well. However, the polycrystalline microstructure of the ferroelectric film degrades the film properties because the grain boundaries are sites for charge segregation and charge decay and the crystalline interfaces are sites for chemical segregation or for formation of secondary phases, all deleterious to device performance. The polycrystalline microstructure has been linked to several critical technology issues: fatigue, aging, lower saturation and remanent polarization, time dependent decay of the polarization, and leakage current.

Several groups have investigated the epitaxial growth of ferroelectric films using a variety of growth processes usually associated with semiconductors. For example, Iijima et al. disclose activated reactive evaporation of ferroelectric films in "Preparation of ferroelectric $BaTiO_3$ thin films by activated reactive evaporation," *Applied Physics Letters*, volume 56, 1990, pages 527-529. They grew several structures, including $BaTiO_3$ on a $SrTiO_3$ substrate and another with a 100 nm epitaxial Pt between the $BaTiO_3$ and the $SrTiO_3$. Such a thin Pt layer was probably required to retain it in the pseudomorphic regime where it would remain epitaxial with the substrate. Less constraint on the design of the lower electrode is desirable.

Davis et al. disclose laser ablation growth of ferroelectric films on LiF substrates in "Epitaxial growth of thin films of $BaTiO_3$ using excimer laser ablation," *Applied Physics Letters*, volume 55, 1989, pages 112-114. This growth technique has found recent popularity in growing the high-temperature superconducting copper oxides, YBaCuO and BiSrCaCuO. They, however, provided no guidance on ways of achieving a lower electrical contact. Laser ablation has been used for the growth of epitaxial heterostructures, for example, superconducting YBaCuO on insulating PrBaCuO, as has been disclosed by Hegde et al. in U.S. Pat. application, Ser. No. 07/360,090, filed Jun. 1, 1989 now U.S. Pat. No. 5,087,605, issued Feb. 11, 1992.

SUMMARY OF THE INVENTION

Accordingly, an object of the invention is to grow a single-crystal ferroelectric film on a conductive layer.

Another object of the invention is to epitaxially grow a ferroelectric film on a crystalline conductive layer of relatively large thickness.

The invention can be summarized as the epitaxial growth of ferroelectric thin films on superconductive cuprate oxide substrates or sublayers.

DETAILED DESCRIPTION OF THE PREFERRED EMBODIMENTS

Figure 1:
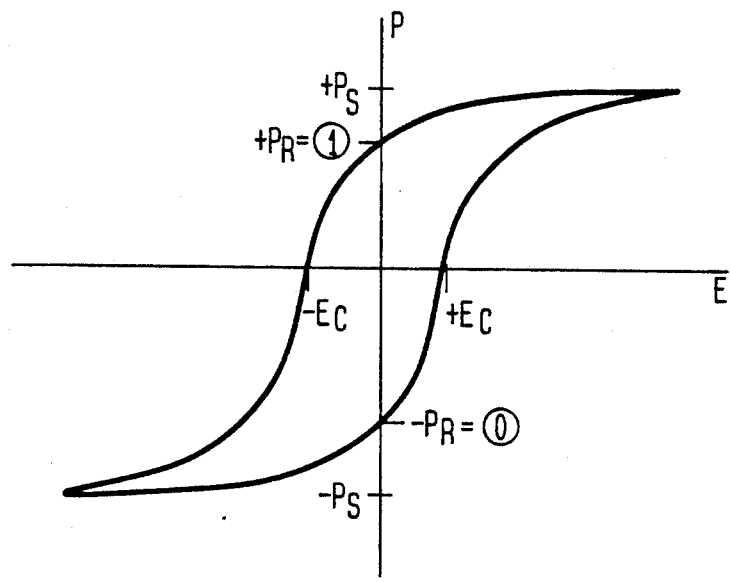
FIG. 1 is a graph illustrating ferroelectric behavior.
Figure 2:
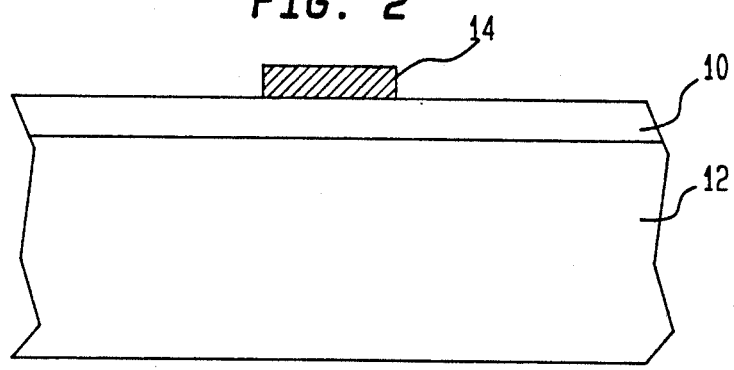
FIGS. 2 and 3 are cross-sectional views of two embodiments of the structure provided by the invention.
Figure 3:
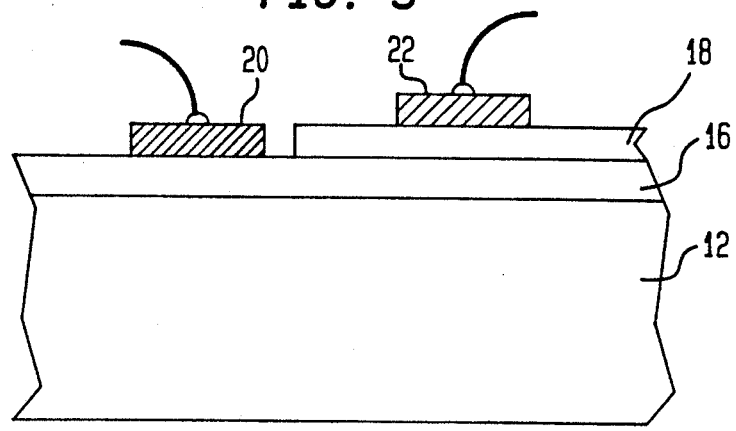

A first embodiment of the invention is illustrated in cross-section in FIG. 2 and includes a ferroelectric thin film 10 epitaxially grown on a bulk substrate 12 of a cuprate perovskite. The composition of the ferroelectric thin film 10 is freely chosen as long as it displays the ferroelectric effect and has the perovskite crystal structure. The perovskite crystal structure is explained by Wells in his book *Structural Inorganic Chemistry*, 4th ed. (Clarendon Press, 1975), pages 149-154. Advantageously, the compositions are those associated with superconductivity. Examples of the ferroelectric materials are listed in TABLE 1. The material PZT is the family of alloys $PbZr_{1-x}Ti_xO_3$. The entries for $T_C$ list the Curie temperatures above which the material ceases to be ferroelectric. The entries for $P_S$ list the saturation polarization. For dense memories $P_S$ should be high.

TABLE 1

| Material | $T_c$ (°C.) | $P_s$ ($\mu C/cm^2$) |
|---|---|---|
| $Bi_4Ti_3O_{12}$ | 675 | 50(b-axis) |
| | | 4(c-axis) |
| $PbTiO_3$ | 490 | >50 |
| $LiNbO_3$ | 1210 | 71 |
| PZT | 300-400 | 6-30 |

The superconducting perovskite substrate may be of any of the family of cuprate perovskite materials which have been observed to exhibit high-temperature superconductivity or closely related to them. Examples of these superconducting materials are listed in TABLE 2. The values of $T_c$ are the superconducting transition temperatures; the values of $p_N$ are the normal state resistivities at room temperature for thin films of these materials.

TABLE 2

| Material | $T_c$ (°K.) | $p_N$ ($\mu\Omega$-cm) |
|---|---|---|
| $YBa_2Cu_3O_{7-x}$ | 91 | 50-250 |
| $Bi_2Sr_2CuO_{6-x}$ | 10 | 1000-2000 |
| $Bi_2Sr_2CaCu_2O_{8+x}$ | 85 | 50-200 |
| $Bi_2Sr_2Ca_2Cu_3O_{10+x}$ | 110 | — |

$YBa_2Cu_3O_{7-x}$ (often referred to as YBCO) is the most extensively studied member of the family $ReBa_2Cu_3O_{7-x}$, where Re is any member of the family of lanthanide rare-earth metal elements, including Y, Ce, Pr, Nd, etc. The members of this family have a perovskite-based crystal structure and most of the members exhibit superconductivity. $Bi_2Sr_2CuO_{6+x}$, $Bi_2Sr_2CaCu_2O_{8+x}$, and $Bi_2Sr_2Ca_2Cu_3O_{10+x}$ are members of the bismuth cuprate superconductors $Bi_2Sr_2Ca_{n-1}Cu_nO_y$. The first is referred to as the "2201" phase; the second as the "2212" phase; and the third as the "2223" phase. The bismuth cuprate superconductors are structurally very similar to $Bi_4Ti_3O_{12}$, are lattice matched on the a-b plane to within 0.5%, and show similar chemistry because of the similarity of their metal components. Another related superconducting alloy is $Ba_{1-x}K_xBiO_3$ which has a superconducing transition temperature and which has a cubic perovskite structure. In these formulas, x and y are fractions between 0 and 1.

Although the ferroelectric film film 10 can be epitaxially deposited by a number of methods, pulsed laser ablation has been demonstrated to provide good ferroelectric films. The pulsed laser process is well known in depositing high $T_c$ films.

EXAMPLE 1

An example of the first embodiment of the invention has been demonstrated using $Bi_4Ti_3O_{12}$ as the ferroelectric film 10 and $Bi_2Sr_2Cu_1O_{6+x}$ (the "2201" phase) as the bulk substrate.

Single crystal of the "2201" phase were grown in a 50 cc alumina crucible containing a 30 gm load of "2202" nominal composition, i.e., a 100% CuO excess as a flux. The load was heated in air at a rate of 300° C./hr up to 900° C. and then at the rate of 80° C./hr up to 1100° C. The melt was maintained at this temperature for 1 hour, cooled to 900° C. at 5° C./hr, and then furnace cooled to room temperature. Upon cooling, platelet-like crystals nucleate and float to the top of the surface of the melt. Large platelets of the "2201" phase of up to 2 cm² were peeled off the top of the crystallized surface. These crystals had grown with a [001] orientation, as determined by x-ray diffraction, and with a composition close to the required "2201" stoichiometry, as determined by energy dispersive x-ray analysis. The bismuth cuprate superconductors are structurally very similar to $Bi_4Ti_3O_{12}$ and are lattice matched on the a-b plane to within 0.5%.

Polycrystalline, single-phase $Bi_4Ti_3O_{12}$ targets for the laser ablation system were prepared by mixing stoichiometric amounts of $Bi_2O_3$ and $TiO_2$ powder, pressing the mixed powders, and sintering at 950° C. or somewhat above for 24 hours.

A [001]-oriented platelet of $Bi_2Sr_2Cu_1O_{6+x}$ was used as the substrate for laser ablative deposition. The substrate holder was kept at 700°-800° C. during deposition but the substrate itself was ~50° C. cooler. A pulse excimer laser having an emission wavelength of 248 nm irradiated the rotating $Bi_4Ti_3O_{12}$ target at a pulse rate of 1 to 10 Hz. The deposition was performed in an oxygen pressure of 50-200 mtorr. After deposition, the films were cooled to room temperature at 7° C./min.

X-ray diffraction patterns obtained from the 750° C. grown sample showed only (00 1) peaks from both the substrate and the film. That is, the c-axis oriented substrate 12 caused the ferroelectric film 10 to grow epitaxially with the same orientation. X-ray rocking curves for the ferroelectric showed a full width at half maximum of ~0.7°, about the same value as for the substrate. No diffraction peaks other than the (00 1) lines of the orthorhombic $Bi_4Ti_3O_{12}$ were observed.

Gold dots 14 of area $4\times10^{-4}$ cm² were evaporated on the surface of the film 10 to provide electrical contact so that its electrical properties could be measured. For a 120 nm thick $Bi_4Ti_3O_{12}$ film, substantially symmetric hysteresis was observed, with a remanent polarization $P_R$ of 1.2 $\mu C/cm^2$, a coercive field $E_C$ of $1.7\times10^5$ V/cm, and a saturation polarization $P_S$ of 3.2 $\mu C/cm^2$ at 15 V. These values are to be compared to bulk c-axis values for $Bi_4Ti_3O_{12}$ of $P_R=4$ $\mu C/cm^2$ and $E_c=50$-70 kV/cm.

EXAMPLE 2

A second example of the invention used laser ablation to grow an epitaxial layer of the "2201" phase $Bi_2Sr_2CuO_{6+x}$ on which the $Bi_4Ti_3O_{12}$ ferroelectric layer is then grown. A $Bi_4Ti_3O_{12}$ target was fabricated by the process described above. All polycrystalline $Bi_2Sr_2Ca_{n-1}Cu_nO_{6+x}$ targets (n=1 for this example) were prepared by mixing appropriate amounts of $Bi_2O_3$, $SrCO_3$, $CaCO_3$, and CuO, sintering the mixture at 860° C. for several days, and repeatedly grinding the partially sintered mixtures at intermediate times. The two targets were mounted on a four-target carousel so that the layers could be grown without exposing the sample to the environment. The carousel has been described by Chase et al. in "Multilayer high $T_c$ thin film structures fabricated by pulsed laser deposition," *Journal of Mate-* rials Research, volume 4, 1989 at pages 1326-1329. The sample holder was held at a temperature in the range 650°-820° C., and the oxygen pressure was held at 50-200 mtorr. Optimum growth conditions for each layer were determined by calibrating depositions on [100] $SrTiO_3$ substrates. A [100]-oriented crystal of $SrTiO_3$ was used as the final substrate 12, and the films grew on it at the rate of 0.05-0.1 nm/sec when the KrF laser irradiated the targets. As a typical example of the heterostructural growth, a BiSrCuO layer 16 was grown to a thickness in the range 100-250 nm with the substrate holder held at 740° C. The temperature was then changed to 750° C., and a bismuth titanate layer 18 was deposited to a thickness in the range of 0.1-1.0 $\mu$m.

The fabricated films were tested by x-ray diffraction. All the observed diffraction peaks, in addition to those of the substrate 12, could be indexed as the (0 0 1) lines from $Bi_4Ti_3O_{12}$ or from the $Bi_2Sr_2CuO_{6+x}$. Rocking curves for both layers 16 and 18 yielded full widths at half maximum of 0.7°-1.0°. The lack of other diffraction peaks demonstrates c-axis orientations for both layers 16 and 18, but the large rocking angle indicates a relatively large density of defects.

In order to form an electrical device operating as a ferroelectric memory, electrodes 20 and 22 should be attached to the upper surfaces of the superconducting layer 16 and the ferroelectric layer 18, respectively. However, for our electrical tests, the unpatterned sample was attached to a glass plate. Gold was deposited over the edge of the sample so as to contact the superconducting layer 16 on its side edge, thus providing the electrical equivalent of the superconducting layer electrode 20. The ferroelectric layer electrode 22 was also made of gold and had a size $4 \times 10^{-4}$ cm². Electrical leads were attached to the electrodes 20 and 22 for Sawyer-Tower tests.

Ferroelectric hysteresis was observed. The observed remanent polarization $P_R$ of 1 $\mu$C/cm² compares to a value of 4 $\mu$C/cm² for a single crystal of the same orientation. The observed coercivity values of 200 kV/cm was much higher than the values of 50-70 kV/cm for single crystals. The smaller remanence is probably due to the thinness of the bismuth titanate films, ~200 nm.

In a related experiment, a 200 nm film of the "2201" phase was deposited on a $SrTiO_3$ substrate, and a 250 nm $Bi_4Ti_3O_{12}$ film was then epitaxially formed. The ferroelectric exhibited a dielectric constant of 130 and a dissipation factor tan $\theta$ of 0.16. The above embodiments have relied upon the use of bottom electrode layers made from superconducting materials. However, the electrical tests were performed at room temperature so that the superconducting layer provided a mere normally conducting electrical contact as well as acting as the epitaxial template for growth of the single crystalline ferroelectric. It is well known that varying the growth temperature and ambient pressure and composition, e.g., $O_2$ or $N_2$, during growth will cause the superconducting layer to change to a normal metal or semiconductor. It is thus not essential that the superconducting layer be of a material that ever exhibits superconductivity.

EXAMPLE 3

In a third example, a 250 nm film of YBCO was deposited by laser ablation on a [001]-oriented $SrTiO_3$ substrate, and a 250 nm film of $Bi_4Ti_3O_{12}$ was then deposited. The YBCO film exhibited a superconducting transition temperature $T_c$ of 85° K. The bismuth titanate film was determined to be entirely c-axis and to exhibit 50% minimum Rutherford backscattering, that is, good crystallinity. It was ferroelectric and showed remanent polarization $P_R = 1.2$ $\mu$C/cm² and a coercivity $E_c = 200$ kV/cm. Similar films were prepared with the thickness of the bismuth titanate layer varied between 100 nm and 1 $\mu$m. The remanent polarization generally increased with increasing thickness of the ferroelectric layer.

EXAMPLE 4

In a fourth example, a 250 nm film of $Bi_4Ti_3O_{12}$ was grown on a 250 nm film of the "2212" phase $Bi_2Sr_2CaCu_2O_{6+x}$, which was itself deposited on [001]-oriented $SrTiO_3$. The "2212" phase exhibited a superconducting transition at 77° K. The ferroelectric layer was entirely c-axis and showed 50% minimum Rutherford backscattering.

EXAMPLE 5

In a fifth example, 250 nm of $BaTiO_3$ was used for the ferroelectric layer. YBCO was used for the superconducting layer. [001]-oriented $SrTiO_3$ was used for the substrate. The ferroelectric layer was entirely c-axis oriented and showed 25-30% minimum Rutherford backscattering, that is, very good crystallinity.

COMPARATIVE EXAMPLE

For a comparative example resembling the prior art, an $SiO_2$ buffer layer was oxidized on a silicon substrate. A lower electrode layer of platinum was deposited on the buffer layer. Then 500 nm of $Bi_4Ti_3O_{12}$ was deposited by laser ablation. Because of the high growth temperatures, the bismuth titanate layer was c-axis oriented. However, there was no channeling, indicating that the ferroelectric layer was polycrystalline.

The invention provides a high-performance, small-scale ferroelectric memory that can be fabricated by relatively simple techniques, not unlike those used in the fabrication of semiconductor integrated circuits. Although only a few examples of the invention have been given, the invention is much broader. For example, other methods of thin film deposition may be used.

What is claimed is:

1. A ferroelectric heterostructure, comprising:
   a singly crystalline body comprising a metal oxide chosen from the group consisting of cuprate oxide and bismuthal oxide, having a perovskite crystal structure, and being conductive; and
   a ferroelectric layer epitaxially formed on said crystalline body.

2. A ferroelectric heterostructure as recited in claim 1, further comprising electrical means connected to said crystalline body and a surface of said ferroelectric layer for applying a voltage across said ferroelectric layer.

3. A ferroelectric heterostructure as recited in claim 2, further comprising an electrode layer formed over said ferroelectric layer and through which said electric means are connected to said surface of said ferroelectric layer.

4. A ferroelectric heterostructure as recited in claim 3, wherein said electrical means selectively bias said ferroelectric layer to one of two states that remain after said electrical means ceases biasing said ferroelectric layer, whereby a non-volatile memory is formed.

5. A ferroelectric non-volatile memory as recited in claim 3, wherein said electrode layer comprises a metal oxide chosen from the group consisting of cuprate oxide and bismuthal oxide, epitaxial with said ferroelectric layer, and conductive.

6. A ferroelectric heterostructure as recited in claim 3, wherein said metal oxide does not exhibit superconductivity at an operating temperature of said heterostructure.

7. A ferroelectric heterostructure as recited in claim 1, wherein said ferroelectric layer comprises bismuth titanate.

8. A ferroelectric heterostructure as recited in claim 1, wherein said ferroelectric layer comprises barium titanate.

9. A ferroelectric heterostructure as recited in claim 1, wherein said metal oxide is a superconductor at a finite temperature.

10. A ferroelectric heterostructure as recited in claim 9, wherein said metal oxide comprises $Ba_{1-x}K_xBiO_3$.

11. A ferroelectric heterostructure as recited in claim 1, wherein said metal oxide comprises $ReBa_2Cu_3O_{7-x}$, wherein Re is a lanthanide rare-earth metal.

12. A ferroelectric heterostructure as recited in claim 1, further comprising a singly crystalline substrate, wherein said crystalline body is a thin film epitaxial with said crystalline substrate.

13. A ferroelectric heterostructure, comprising:
a singly crystalline body comprising a metal oxide which has a perovskite crystal structure and is a superconductor at a finite temperature wherein said metal oxide comprises $Bi_2Sr_2Ca_{n-1}Cu_nO_y$, wherein n is an integer greater than zero; and
a ferroelectric layer epitaxially formed on said crystalline body.

14. A method of forming a ferroelectric device, comprising the steps of:
epitaxially depositing a ferroelectric layer upon a conductive singly crystalline body comprising a metal oxide chosen from the group consisting of a cuprate oxide and a bismuthal oxide and having a perovskite crystal structure; and
operatively connecting electrical leads to said body and to an upper surface of said ferroelectric layer.

15. A method as recited in claim 14, further comprising a step of:
epitaxially depositing said conductive body as a thin film upon a crystalline substrate.

16. A method as recited in claim 15, wherein said two depositing steps comprise pulsed energy evaporation.

17. A method as recited in claim 16, wherein said pulsed energy evaporation uses a pulsed laser.

18. A ferroelectric heterostructure, comprising:
a singly crystalline body comprising a metal oxide comprising $YBa_2Cu_3O_{7-x}$, having a perovskite crystal structure, and being conductive; and
a ferroelectric layer epitaxially formed on said crystalline body.

19. A ferroelectric heterostructure as recited in claim 18, wherein said ferroelectric layer comprises lead zirconate titanate.

20. A ferroelectric memory, comprising: a substrate
a lower electrode comprising a thin film of a conductive first metal oxide deposited on said substrate;
a ferroelectric layer deposited on said lower electrode;
an upper electrode comprising a thin film of a conductive second metal oxide deposited on said ferroelectric layer; and
electrical means connected to said upper and lower electrodes for selectively biasing said ferroelectric layer to one of two states that remain after said electrical means ceases biasing said ferroelectric layer, whereby a non-volatile memory is formed.

21. A ferroelectric memory as recited in claim 20, wherein said first and second metal oxides comprise a same metal oxide.

22. A ferroelectric memory as recited in claim 21, wherein said same metal oxide comprises $YBa_2Cu_3O_{7-x}$.

23. A ferroelectric memory as recited in claim 21, wherein said first and second metal oxides are normally conductive at an operating temperature of said ferroelectric memory.

* * * * *